United States Patent
Chao et al.

(10) Patent No.: US 8,451,971 B2
(45) Date of Patent: May 28, 2013

(54) COMMUNICATION SYSTEMS, CLOCK GENERATION CIRCUITS THEREOF, AND METHOD FOR GENERATING CLOCK SIGNAL

(75) Inventors: Kuan-Hua Chao, Taipei County (TW); Shiue-Shin Liu, HsinChu (TW); Jeng-Horng Tsai, Kao-Hsiung (TW); Chih-Ching Chen, Miaoli County (TW); Chuan Liu, Hsinchu (TW); Tse-Hsiang Hsu, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 751 days.

(21) Appl. No.: 12/407,226

(22) Filed: Mar. 19, 2009

(65) Prior Publication Data

US 2009/0296869 A1 Dec. 3, 2009

Related U.S. Application Data

(60) Provisional application No. 61/057,226, filed on May 30, 2008.

(51) Int. Cl.
*H04L 7/00* (2006.01)
*H03L 7/06* (2006.01)

(52) U.S. Cl.
USPC ........... 375/376; 375/373; 375/354; 375/286; 375/327; 327/156

(58) Field of Classification Search
USPC ........................... 375/375, 327, 376; 327/156
See application file for complete search history.

(56) References Cited

U.S. PATENT DOCUMENTS

| | | | |
|---|---|---|---|
| 5,065,384 | A | 11/1991 | Yokogawa |
| 5,319,680 | A | 6/1994 | Port et al. |
| 5,483,201 | A | 1/1996 | Bortolini |
| 5,530,389 | A | 6/1996 | Rieder |
| 5,564,042 | A | 10/1996 | Ventrone et al. |
| 6,297,705 | B1 | 10/2001 | Williams et al. |
| 6,525,578 | B2 | 2/2003 | Ooishi |
| 6,606,365 | B1 * | 8/2003 | Chen .......................... 375/376 |

(Continued)

FOREIGN PATENT DOCUMENTS

| | | |
|---|---|---|
| CN | 1104818 | 7/1995 |
| CN | 1953332 | 4/2007 |

(Continued)

OTHER PUBLICATIONS

English language translation of abstract of CN 1953332 (published Apr. 25, 2007).

(Continued)

*Primary Examiner* — Shuwang Liu
*Assistant Examiner* — Ross Varndell
(74) *Attorney, Agent, or Firm* — McClure, Qualey & Rodak, LLP (57) ABSTRACT

A clock generation circuit is provided and includes a phase locked loop (PLL) and a calibrator. The PLL is arranged to receive a first clock signal and generate the output clock signal. The PLL adjusts the frequency of the output clock signal according to a control signal. The calibrator is arranged to receive the output clock signal and a second clock signal, execute a frequency calibration between the output clock signal and the second clock signal, and generate the control signal according to results of the frequency calibration.

39 Claims, 11 Drawing Sheets

U.S. PATENT DOCUMENTS

| | | |
|---|---|---|
| 6,795,043 B2 | 9/2004 | Shibata |
| 7,065,025 B2 | 6/2006 | Kiyose |
| 7,082,177 B2 | 7/2006 | Arkiszewski |
| 7,194,059 B2 | 3/2007 | Wong et al. |
| 7,263,153 B2 | 8/2007 | Sutioso et al. |
| 7,743,168 B2 * | 6/2010 | Tang et al. .............. 375/372 |
| 7,839,965 B2 | 11/2010 | Wilson et al. |
| 2004/0071251 A1 * | 4/2004 | Sutioso et al. ............ 375/373 |
| 2004/0113704 A1 | 6/2004 | Ho |
| 2005/0063494 A1 | 3/2005 | Gregorius et al. |
| 2006/0119443 A1 | 6/2006 | Azam et al. |
| 2006/0120489 A1 | 6/2006 | Lee |
| 2007/0069825 A1 | 3/2007 | Wong et al. |
| 2007/0195916 A1 | 8/2007 | Itahara |
| 2007/0226531 A1 | 9/2007 | Park et al. |
| 2007/0297553 A1 | 12/2007 | Sutioso et al. |
| 2009/0189801 A1 | 7/2009 | Forstner et al. |
| 2011/0102258 A1 | 5/2011 | Underbrink et al. |

FOREIGN PATENT DOCUMENTS

| | | |
|---|---|---|
| TW | 200713835 | 4/2011 |
| TW | 200723703 | 7/2011 |
| WO | WO 2006/011680 | 2/2006 |

OTHER PUBLICATIONS

English language translation of abstract of CN 1104818 (published Jul. 5, 1995).

* cited by examiner

COMMUNICATION SYSTEMS, CLOCK GENERATION CIRCUITS THEREOF, AND METHOD FOR GENERATING CLOCK SIGNAL

CROSS REFERENCE TO RELATED APPLICATIONS

The present application claims the benefit of U.S. provisional application entitled "FREQUENCY COMPENSATION TECHNIQUE", Ser. No. 61/057,226, filed May 30, 2008.

BACKGROUND OF THE INVENTION

1. Field of the Invention

The invention relates to a clock generation circuit, and more particularly to a clock generation circuit whose output clock signal can be adjusted to be within a frequency ppm range defined by a specification.

2. Description of the Related Art

Figure 1:
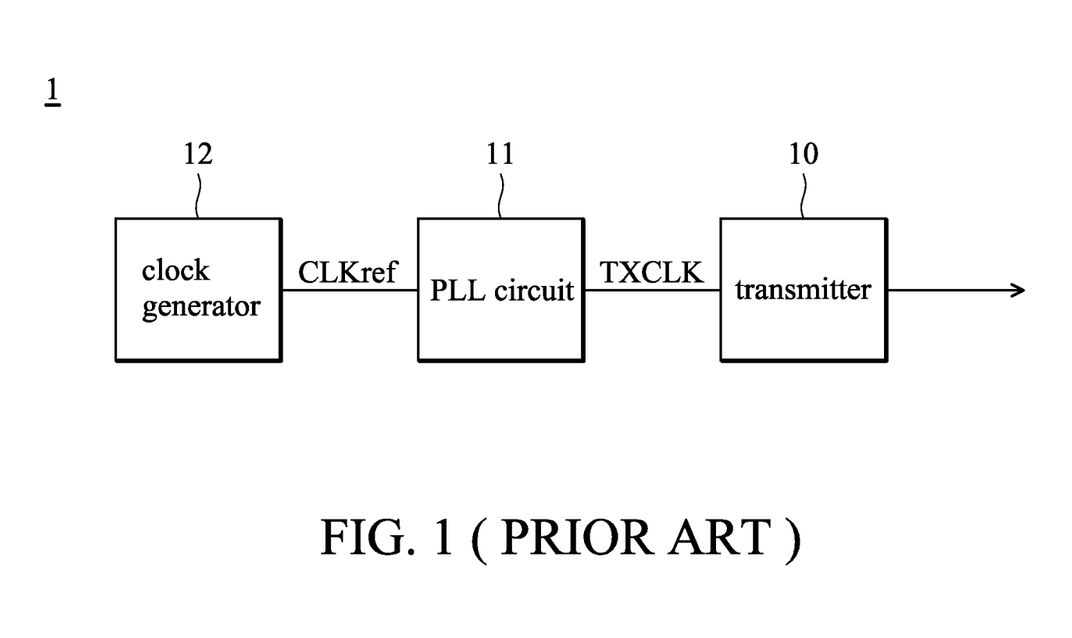
FIG. 1 shows a conventional transmission device with a frequency generator.

FIG. 1 shows a conventional transmission device 1, which comprises a transmitter 10, a phase locked loop (PLL) circuit 11, and a clock generator 12. The clock generator 12 generates a reference clock signal CLKref, which is provided to the PLL circuit 11. The PLL circuit 11 generates a clock signal TXCLK to the transmitter 10 according to the reference clock signal CLKref, and the transmitter 10 transmits data with the clock signal TXCLK. Since the clock signal TXCLK is generated according to the reference clock signal CLKref, the frequency ppm range of the clock signal TXCLK is dominated by that of the reference clock signal CLKref, such as the specification of SATA (Serial Advanced Technology Attachment) restricts output clock frequency within +/−350 ppm without using a spread spectrum clock (SSC) component. The specification of a high-speed link usually defines a ppm range for frequency of transmitted data. If the frequency of the reference clock signal CLKref does not conform to the defined frequency ppm range of the specification, the frequency of the clock TXCLK is hard to conform to the defined frequency ppm range, so that the transmitted data eventually does not meet the specification.

In general, the clock generator 12 is implemented by an on-board clock source, such as a crystal or a resonator. A crystal has a concentrated frequency ppm range; however, compared with a resonator, the crystal has a higher cost. In the other hand, it is difficult controlled the frequency of the resonator, which is a cheaper choice of the clock generator 12, to conform to a frequency ppm range defined by a required specification. Thus, if a resonator is used for implementation for lower costs, it is likely that the frequency of the reference clock signal CLKref will possible not conform to the defined ppm range.

Thus, it is desired to provide a clock generation device for a transmitter, which uses a low-cost reference clock generator and generates a clock signal whose frequency conforms to the frequency ppm range defined by a specification, so that the output data of the transmitter meet the specification.

BRIEF SUMMARY OF THE INVENTION

An exemplary embodiment of a clock generation circuit for a transmitter which transmits data according to an output clock signal is provided. The clock generation circuit comprises a phase locked loop (PLL) and a calibrator. The PLL is arranged to receive a first clock signal and generate the output clock signal. The PLL adjusts the frequency of the output clock signal according to a control signal. The calibrator is arranged to receive the output clock signal and a second clock signal, execute a frequency calibration between the output clock signal and the second clock signal, and generate the control signal according to results of the frequency calibration.

An exemplary embodiment of a device communicating with a host is provided. The device comprises a receiver, a phase locked loop (PLL), a calibrator, and a transmitter. The receiver is arranged to receive host data from the host and recover the host data to generate a host clock signal. The PLL is arranged to receive a local clock signal, controlled by a control signal, and generate an output clock signal according to the local clock signal and the control signal. The calibrator is arranged to receive the output clock signal and the host clock signal, operate a frequency calibration between the output clock signal and the host clock signal, and generate the control signal according to results of the frequency calibration. The PLL adjusts the frequency of the output clock signal according to the control signal. The transmitter is arranged to transmit device data according to the output clock signal.

An exemplary embodiment of a communication system is provided. The communication system comprises a host and a device. The host comprises a host transmitter and a host receiver. The host transmitter transmits a host data. The device communicates with the host and receives the host data. The device comprises a device receiver, a clock generator, a phase locked loop (PLL), a calibrator, and a device transmitter. The device receiver is arranged to receive and recover host data to generate a host clock signal. The clock unit is arranged to generate a local clock signal. The PLL is arranged to receive the local clock signal and generate an output clock signal according to the local clock signal and a control signal. The calibrator is arranged to receive the output clock signal and the host clock signal, operate a frequency calibration between the output clock signal and the host clock signal, and generate the control signal according to results of the frequency calibration. The PLL adjusts the frequency of the output clock signal according to the control signal. The device transmitter is arranged to transmit device data according to the output clock signal to the host receiver.

An exemplary embodiment of a method used to generate an output clock signal for a transmitter to transmit data is provided. The method comprises the steps of receiving a first clock signal; processing the first clock signal by a phase locked loop (PLL) and outputting the output clock signal accordingly; and calibrating the output clock signal with a second clock signal and generating a calibration result for the phase locked loop. The output clock signal tracks the second clock signal according to the calibration result.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
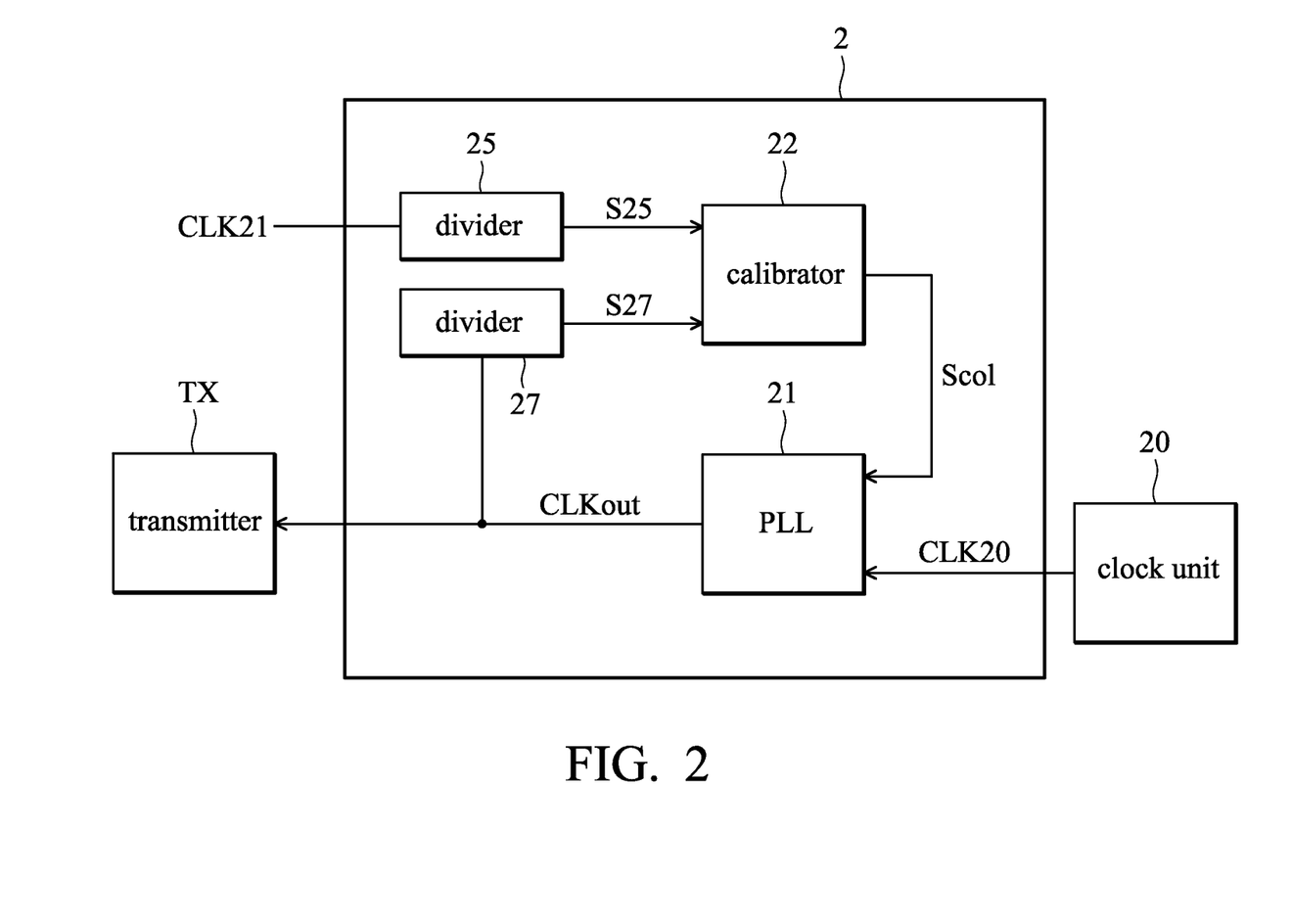
FIG. 2 shows an exemplary embodiment of a clock generation circuit.

Clock generation circuits are provided. In an exemplary embodiment of a clock generation circuit as shown in FIG. 2, a clock generation circuit 2 is arranged to generate an output clock CLKout, and then the output clock signal CLKout is provided to a transmitter TX. The frequency of the output clock signal CLKout is expected to conform to a frequency ppm range defined by a required specification. The transmitter TX transmits data according to the output clock signal CLKout. Referring to FIG. 2, the clock generation circuit 2 comprises a phase locked loop (PLL) 21 and a calibrator 22 to receive a clock signal (CLK20) and a clock signal (CLK21) to generate an output clock signal (CLKout). Furthermore, a clock unit 20 generates the clock signal CLK20 inputting to the phase locked loop (PLL) 21. In the embodiment, the clock unit 20 may be implemented by an on-board clock source, such as a crystal, resonator, or a ring oscillator, thus the clock signal CLK20 can be taken as a local clock signal. The PLL 21 receives the clock signal CLK20 that serves as a reference clock signal. The PLL is further controlled by a control signal Scol and generates the output clock signal CLKout according to the reference clock signal CLK20 and the control signal Scol. The PLL 21 adjusts the frequency of the clock signal CLK20 to generate the output clock signal CLKout according to the control signal Scol. The calibrator 22 receives the output clock signal CLKout and a clock signal CLK21. In the embodiment, the clock signal CLK 21 CLK21 is typically provided from an external device outside the clock generation circuit 2 rather than an on-board clock or internal generated clock for the clock generation circuit 2, and the frequency of the clock signal CLK21 accurately conforms to the defined frequency ppm range.

When the frequency of the clock signal CLK20 does not conform to the defined frequency ppm range, the frequency of the output clock signal CLKout generated based on the clock signal CLK20 usually does not conform to the defined frequency ppm range as well. In the embodiment, the calibrator 22 is arranged to perform calibration between the output clock signal CLKout and the clock signal CLK21 and generates the control signal Scol according to the calibration result. Then, the PLL 21 adjusts the frequency of the output clock signal CLKout according to the control signal Scol. Therefore, the clock generation circuit 2 can be taken as a calibration loop, which is used to receive the reference clock signal CLK20 from the clock unit 20 and the clock signal CLK21 conformed to the defined frequency ppm range. The calibration loop generates the output clock signal CLKout and thereby the output clock signal CLKout tracks the CLK21 according to results of the calibration.

In some embodiments, before the calibrator 22 receives the clock signal CLK21, the PLL 21 generates the output clock signal CLKout according to the clock signal CLK20. After the calibrator 22 receives the clock signal CLK21, the PLL 21 switches to generate the output clock signal CLKout according to the clock signal CLK20 when a frequency of the output clock signal CLKout is generated according to the clock signal CLK20 is not within a range required for specification of the transmitter.

Moreover, there are dividers 25 and 27 further configured in variance of the clock generation circuit 2. The divider 25 receives and divides the frequency of the clock signal CLK21 by a predetermined value M to generate a divided clock signal S25. The divider 27 receives and divides the frequency of the output clock signal CLKout by the predetermined values N to generate a divided clock signal S27. Thus, the dividers 25 and 27 are used to adjust the clock signal CLK21 and the output clock signal CLKout to be in same frequency domain. For example, if frequency of the clock signal CLK 21 is 100 [MHz], and frequency of the output clock signal CLKout is 1 [MHz], thus the predetermined values M and N can be respectively taken as 10 and 0.1 to reach the same frequency domain of 10[MHz].

It should be noted that the predetermined values M and N can be selected to be 1. However, when the dividers 25 and 27 are selected to be 1, the dividers 25 and 27 should not be necessary; the dividers 25 and 27 can be omitted from the clock generation circuit 2. Thus, the calibrator 22 receives the clock signal CLK21 and the output clock signal CLKout directly. Moreover, in other embodiments, the dividers 25 and 27 can be configured in the calibrator 22, and operate with the same function, the related description is omitted here for simplicity.

Moreover, the phase locked loop (PLL) 21 can be replaced by a frequency locked loop (not shown) to generate the output clock signal CLKout. The detail is omitted here for simplicity.

Figure 3:
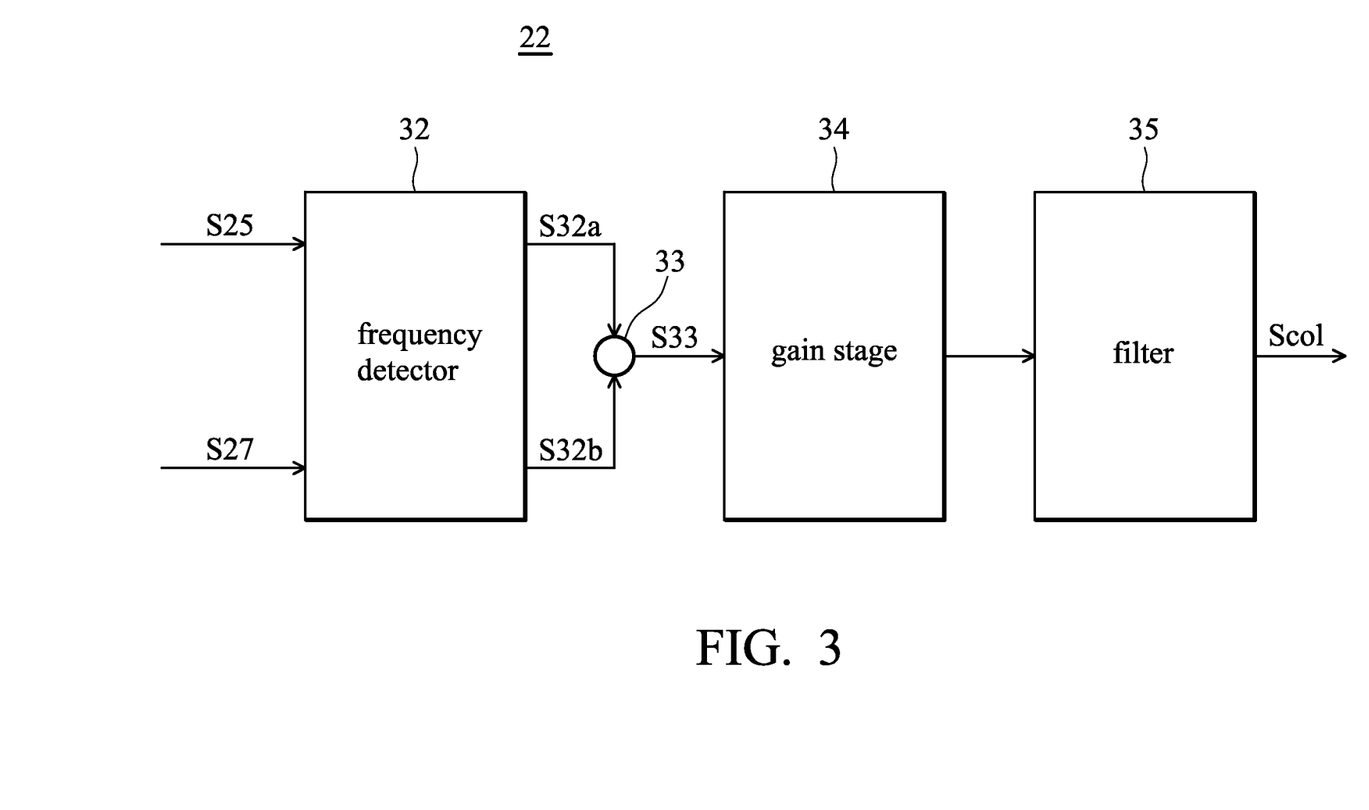
FIG. 3 shows an exemplary embodiment of a calibrator.

FIG. 3 shows an exemplary embodiment of the calibrator 22. The calibrator 22 comprises a frequency detector 32, a calculation unit 33, a gain stage 34, and a filter 35. The frequency detector 32 receives the divided clock signals S25 and S27. The frequency detector 32 determines which one of frequency of the divided clock signals S25 and S27 is higher, and generates detection signals S32a and S32b according to the determined result. The calculation unit 33, such as an adder or a subtractor, is used to process calculation of the detection signals S32a and S32b.

When the frequency detector 32 detects that the frequency of the divided signal S25 from the clock signal CLK21 higher than the frequency of the divided signal S27 from the output clock signal CLKout (in other words, the frequency of the output clock signal CLKout is less than the frequency of the clock signal CLK21), the frequency detector 32 cooperates with the calculation unit 33 to change the value derived from the detection signal S32a to be greater than the value derived from the detection signal S32b. The calculation unit 33 subtracts the detection signal S32b from the detection signal S32a and generates a calculation signal S33 with a positive value. The gain stage 34 processes the calculation signal S33, and then the filter 35 filters the amplified calculation signal S33 to generate the control signal Scol. At this time, the value derived from the control signal Scol is increased according to the calculation signal S33 with the positive value, so that the PLL 21 increases the frequency of the output clock signal CLKout according to the control signal Scol with the increased value.

In contrary, when the frequency detector 32 detects that the frequency of the divided signal S25 from the clock signal CLK21 lower than the divided signal S27 from the output clock signal CLKout (in other words, the frequency of the output clock signal CLKout is greater than the frequency of the clock signal CLK21), the frequency detector 32 cooperates with the calculation unit 33 to change the value derived from the detection signal S32b to be greater than the value derived from the detection signal S32a. The calculation unit 33 subtracts the detection signal S32b from the detection signal S32a and generates a calculation signal S33 with a negative value. The gain stage 34 amplifies the calculation signal S33, and then the filter 35 filters the amplified calculation signal S33 to generate the control signal Scol. At this time, the value derived from the control signal Scol is decreased according to the calculation signal S33 with the negative value, so that the PLL 21 decreases the frequency of the output clock signal CLKout according to the control signal Scol with the decreased value.

In some embodiments, the frequency detector 32 and the calculation unit 33 are implemented to be a single element, such as a detection/calculation unit (not shown). Thus, the detection/calculation unit generates the calculation signal S33 indicating the difference between the divided clock signals S25 and S27. Moreover, in other embodiments, the gain stage 34 can be omitted, or can be implemented with the calculation unit 33 to be a single element, such as a calculation/gain unit (not shown). Thus, the detection signals S32a and S32b can be calculated and gain-adjusted by the calculation/gain unit for further process of the filter 35.

According to above embodiment, the transmitter TX transmits data according to the output clock signal CLKout. The frequency of the output clock signal CLKout is adjusted according to the calibration between the output clock signal CLKout and the precise clock signal CLK21 in order to conform to the defined frequency ppm range. In detail, the output clock signal CLKout tracks the clock signal CLK21 through clock generation circuit 2. Moreover, the frequency of the output clock signal CLKout varies with the frequency precise clock signal CLK21, and further the frequency of the output clock signal CLKout is approximately equal to the frequency of the precise clock signal CLK21 with somewhat circuit delay after the calibration. Therefore, even if the clock unit 20 is implemented by an element which is cheaper but difficultly controlled to conform to the defined frequency ppm range, the output clock signal CLKout for data transmission can conform to the defined frequency ppm range. Thus, the data transmitted by the transmitter TX meets the specification.

Moreover, the frequency detector 32 can be replaced by phase-frequency detector, which is used to detect phase and frequency difference between the divided clock signals S30 and S31. It means that the phase-frequency detector is used to determine which one of the divided clock signals S30 and S31 leads the other and thus the calibrator 22 uses the detection result to execute the calibration process.

Figure 4:
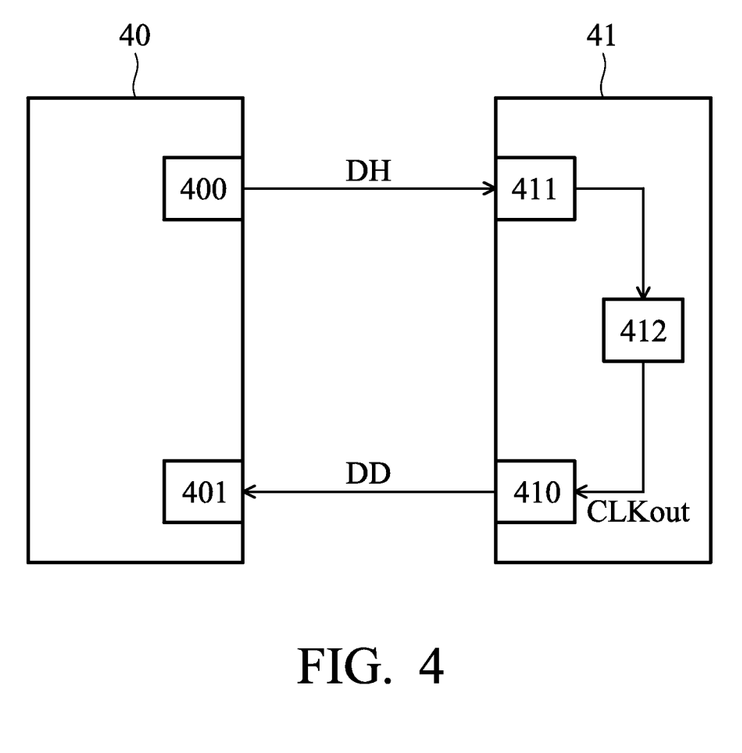
FIG. 4 shows an exemplary embodiment of a communication system.

In some embodiments, the clock generation circuit 2 shown in FIG. 2 can be applied in a communication system, such as applied in a SATA system. Referring to FIG. 4, a communication system 4 comprises a host 40 and a device 41. The host 40 comprises a host transmitter 400 and a host receiver 401. The device 41 comprises a device transmitter 410, a device receiver 411, and the clock generation circuit 412. The host transmitter 400 of the host 40 transmits host data DH to the device receiver 411 of the device 41. The clock generation circuit 412 generates an output clock signal CLKout, and the device transmitter 410 of the device 41 transmits device data DD to the host receiver 401 of the host 40 according to the output clock signal CLKout.

Figure 5A:
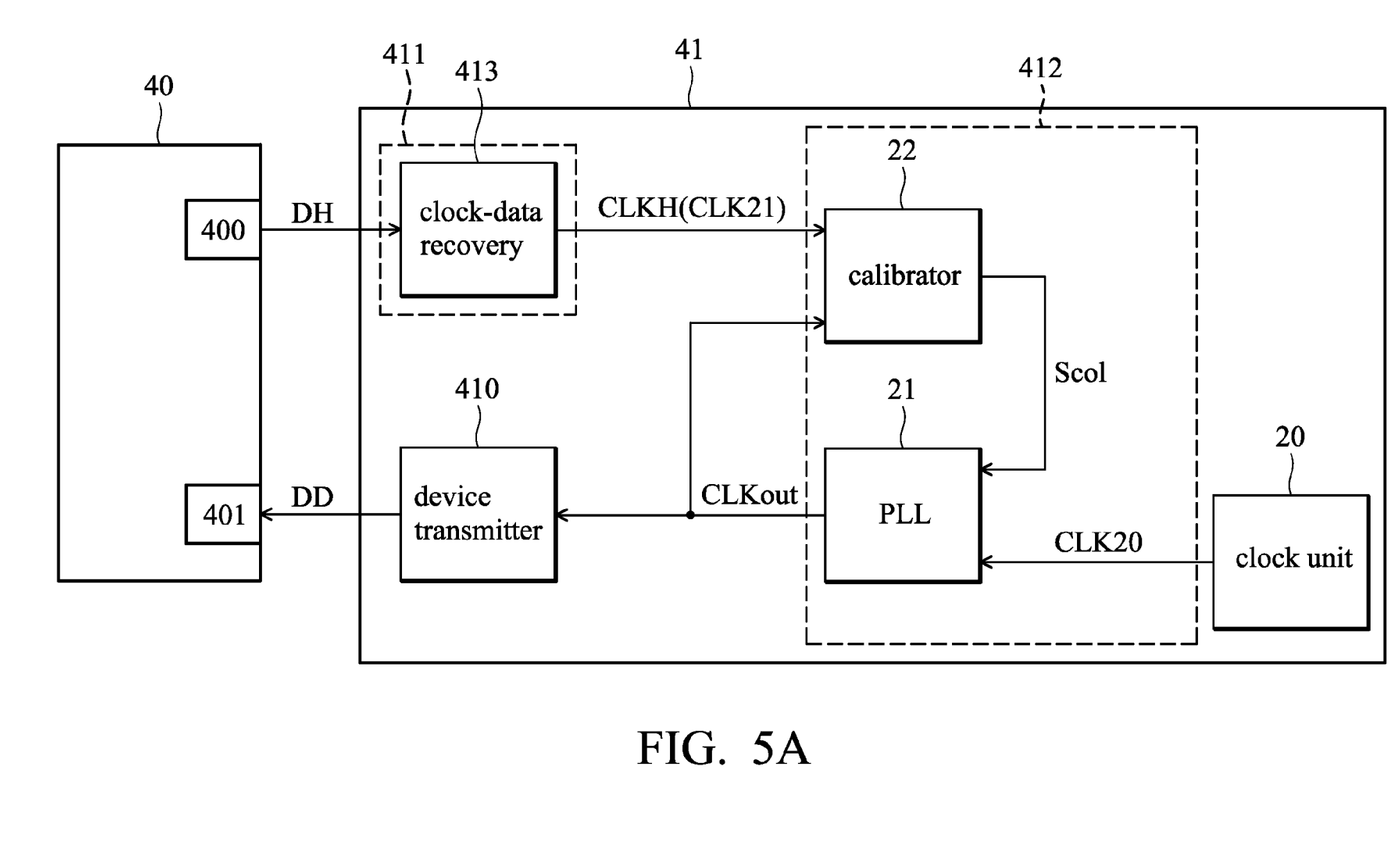
FIG. 5A shows an exemplary embodiment of the detailed communication system of FIG. 4.

Referring to FIG. 5A, the device receiver 411 comprises a clock-data recovery circuit 413. The clock generation circuit 412 is implemented by the same elements as the clock generation circuit 2 of FIG. 2. The same elements of the clock generation circuits 412 and 2 are labeled by the same reference and perform the same operations. In the embodiment of FIG. 5, the clock-data recovery circuit 413 receives the host data DH from the host transmitter 400 and recovers the host data DH to generate a host clock signal CLKH, wherein the host clock signal CLKH serves as a precise clock signal like the CLK21 which is received by the calibrator 22. The calibrator 22 and the PLL 21 respectively perform the same operations as described of FIG. 2. The frequency of the output clock signal CLKout varies with the frequency of the host clock signal CLKH, and further the frequency of the output clock signal CLKout is equal to the frequency of the host clock signal CLK21. In practice, the host clock signal CLKH conforms a frequency ppm range defined by a required specification of the communication system 4, thus, the output clock signal CLKout also conforms to the defined frequency ppm range. The device data DD transmitted from the device transmitter 410 to the host receiver 401 conforms to the required specification thereby.

Moreover, since the clock adjustment is performed by a closed feedback loop formed between the PLL 21 and calibrator 22, and the PLL 21 and calibrator 22 are configured together to perform with effect of a low pass filter, thus the jitter from the host data DH is restrained, and further the jitter resulted from the clock-data recovery circuit 413 is decreased. The noise generated in the output clock signal CLKout is also restrained due to the closed feedback loop.

In some embodiments, the host clock signal CLKH comprises a SSC component. In the case, since the frequency of the output clock signal CLKout varies with the frequency of the host clock signal CLKH, the device data DD transmitted from the device transmitter 410 according to the output clock signal CLKout also comprises the SSC component.

Figure 5B:
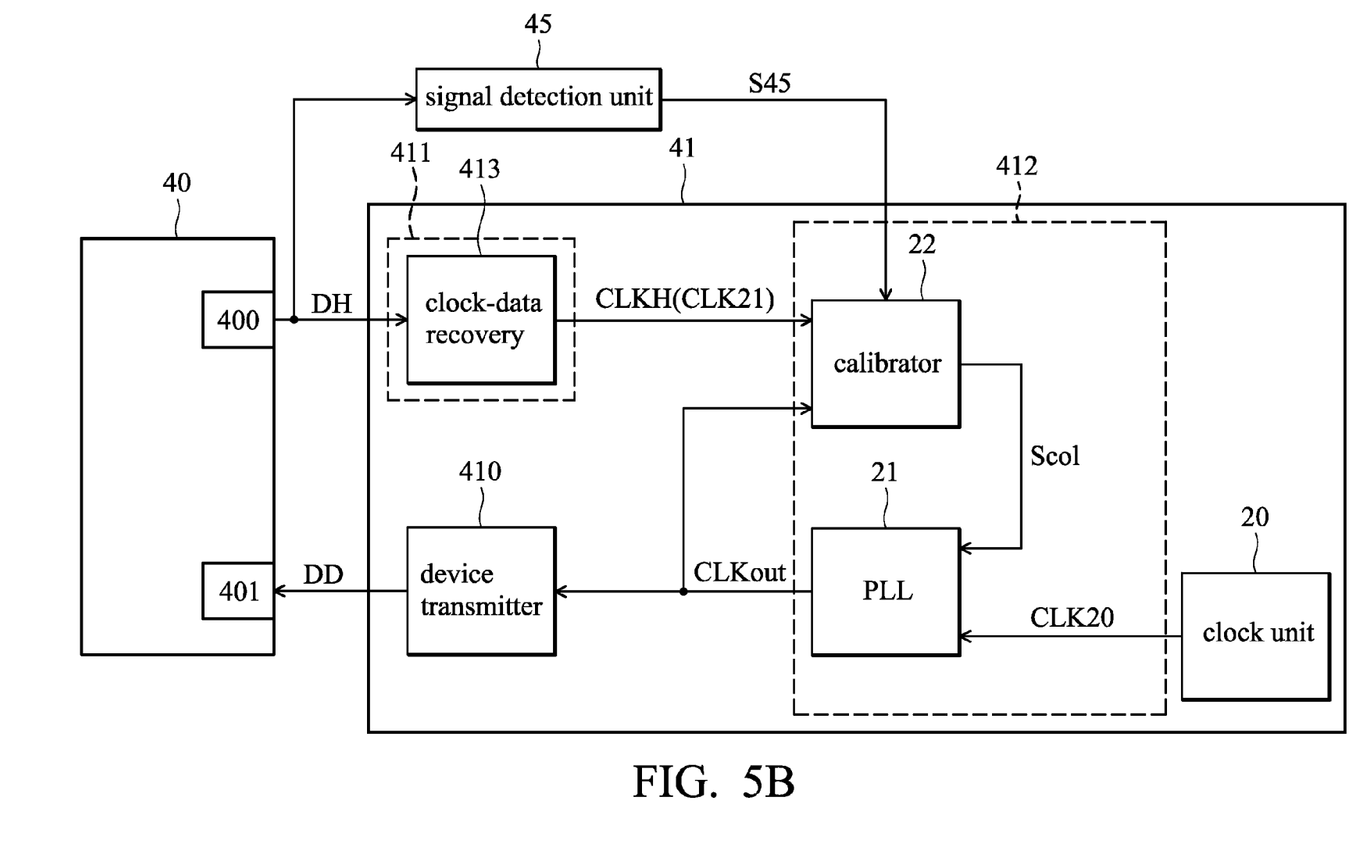
FIG. 5B shows another exemplary embodiment of the detailed communication system of FIG. 4.

Referring to FIG. 5B, the communication system 4 further comprises a signal detection unit 45 compared with FIG. 5A. In some embodiments, the host transmitter 400 generates the host data DH intermittently, and the signal detection unit 45 is thus used to detect the generation of the host data DH for controlling the action of the calibrator 22. When detecting that the host data DH does not exist, the signal detection unit 45 generates a flag signal S45 to the calibrator 22 (or set a flag signal S45, which is output to the calibrator 22, to be at a first potential, such as a high potential) for stopping the calibrator 22 from executing the frequency calibration between the output clock signal CLKout and the host clock signal CLKH. In contrast, when detecting that the host data DH exists, the signal detection unit 45 does not generate the flag signal S45 to the calibrator 22 (or set the flag signal S45 to be at a second potential, such as a low potential), and the calibrator 22 then performs the frequency calibration between the output clock signal CLKout and the host clock signal CLKH.

Figure 5C:
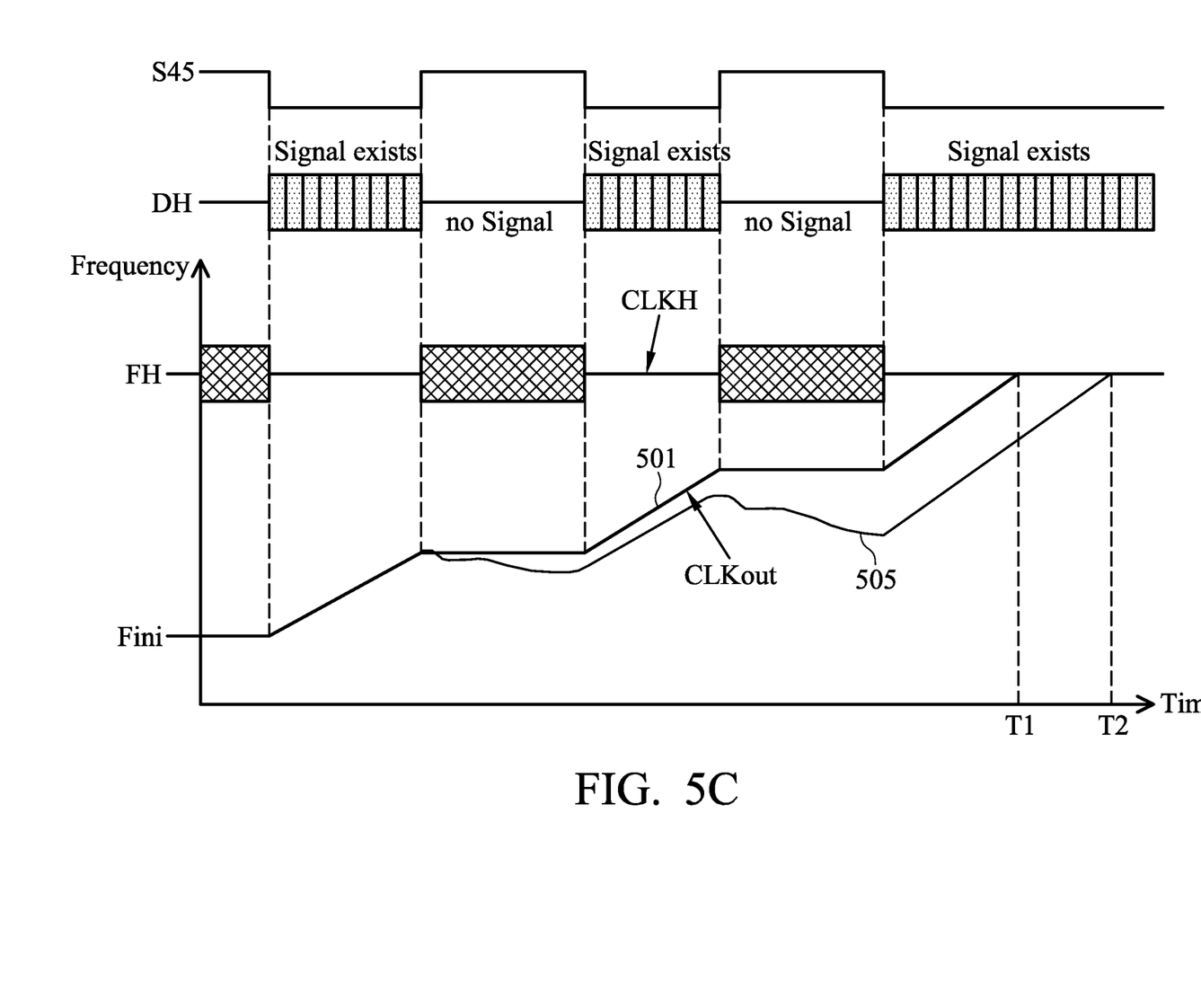
FIG. 5C shows waveforms of the signals of FIG. 5B.

FIG. 5C shows waveforms of the signals of FIG. 5B. The waveforms are described by an example that after the communication system is initially powered on, the output clock signal CLKout is increased from a lower device initial clock frequency Fini by the frequency calibration to reach a host clock frequency FH. First, since the host clock signal CLKH is recovered according to the host data DH by the clock-data recovery 413, the frequency of the host clock signal CLKH is not equal to the host clock frequency FH when the host data DH does not exist. In other words, during the host data DH does not exist, the host clock signal CLKH drafts to wrong frequency. At this time, if the calibrator 22 executes the frequency calibration based on the host clock signal CLKH with the wrong frequency, the calibrator 22 can not generate the correct control signal Scol for controlling the PLL 21 to generate the correct output clock signal CLKout. Thus, the calibrator 22 can not efficiently generate the correct output clock signal CLKout.

To avoid this situation, the potential change of the flag signal S45 generated according to whether the host data DH exists is used to control the calibrator 22 to execute the frequency calibration or not. As shown by a curve 501 in FIG. 5C, when the host data DH exists, the frequency of the host clock signal CLKH is equal to the host clock frequency FH. At this time, the flag signal S45 is at a low potential, so that the calibrator 22 executes the frequency calibration, and the frequency of the output clock signal CLKout begins rising to track the frequency of the host clock signal CLKH. When the host data DH does not exist, the frequency of the host clock signal CLKH is not equal to the host clock frequency FH, as shown by the reticulate marks. At this time, the flag signal S45 changed to a high potential, so that the calibrator 22 stops executing the frequency calibration, and the frequency of the output clock signal CLKout is fixed and waits for the next frequency calibration execution to continuously track the frequency of the host clock signal CLKH. After several times of the frequency calibration execution, the output clock signal CLKout catches the host clock signal CLKH at the time point T1 and thus has the same frequency as the frequency of the host clock signal CLKH.

In contrast, if there is no flag signal S45, which is generated according to whether the host data DH exists, to control the calibrator 22 to execute the frequency calibration, the calibrator 22 may execute the frequency calibration according to the wrong host clock signal CLKH when the host data DH does not exist. For an example shown by a curve 505 in FIG. 5C, when the host data DH does not exist, the frequency of the output clock signal CLKout is decreased. Thus, the time point when the output clock signal CLKout catches the host clock signal CLKH is delayed from T1 to be T2.

Figure 6:
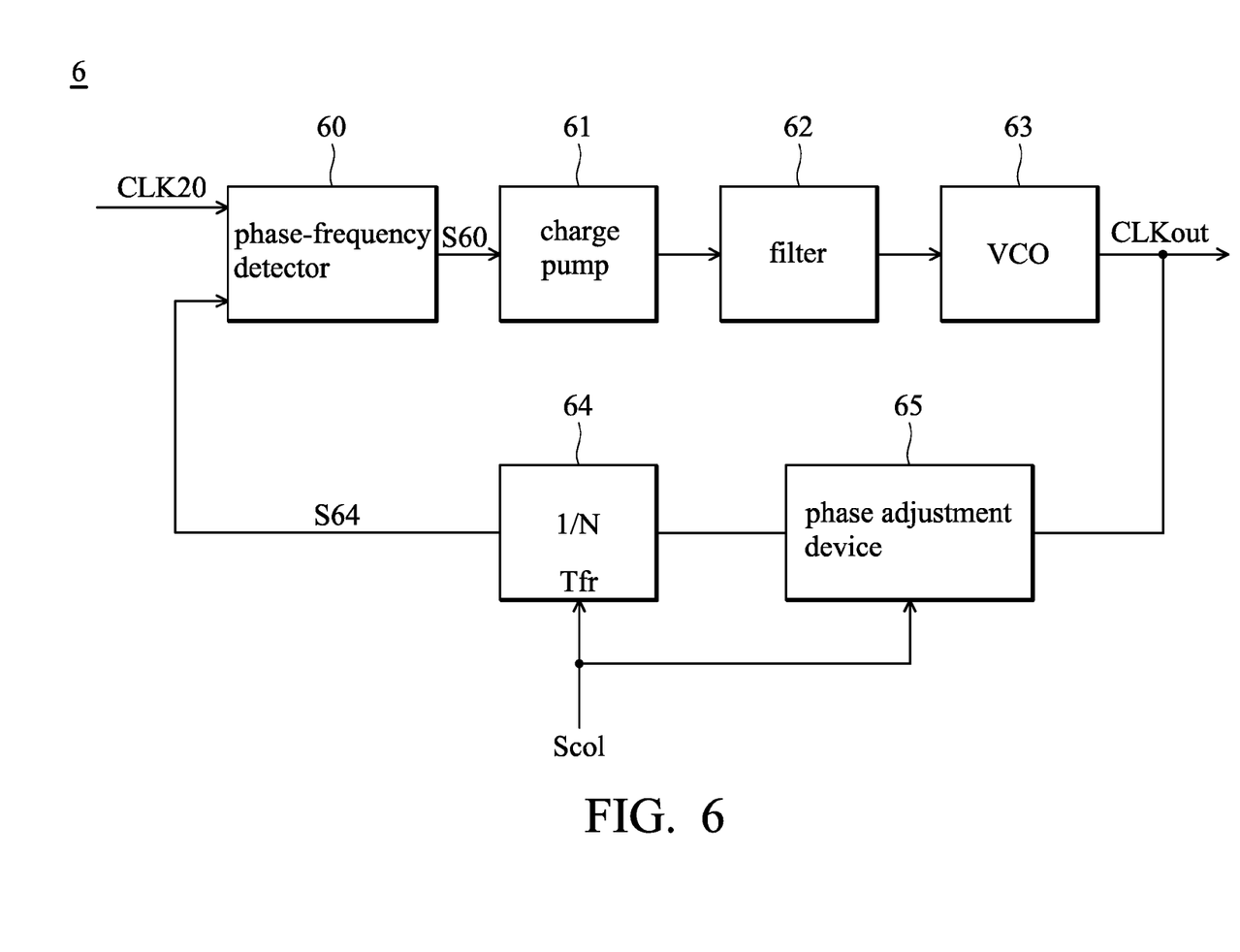
FIG. 6 shows an exemplary embodiment of a fractional-N PLL.
Figure 7:
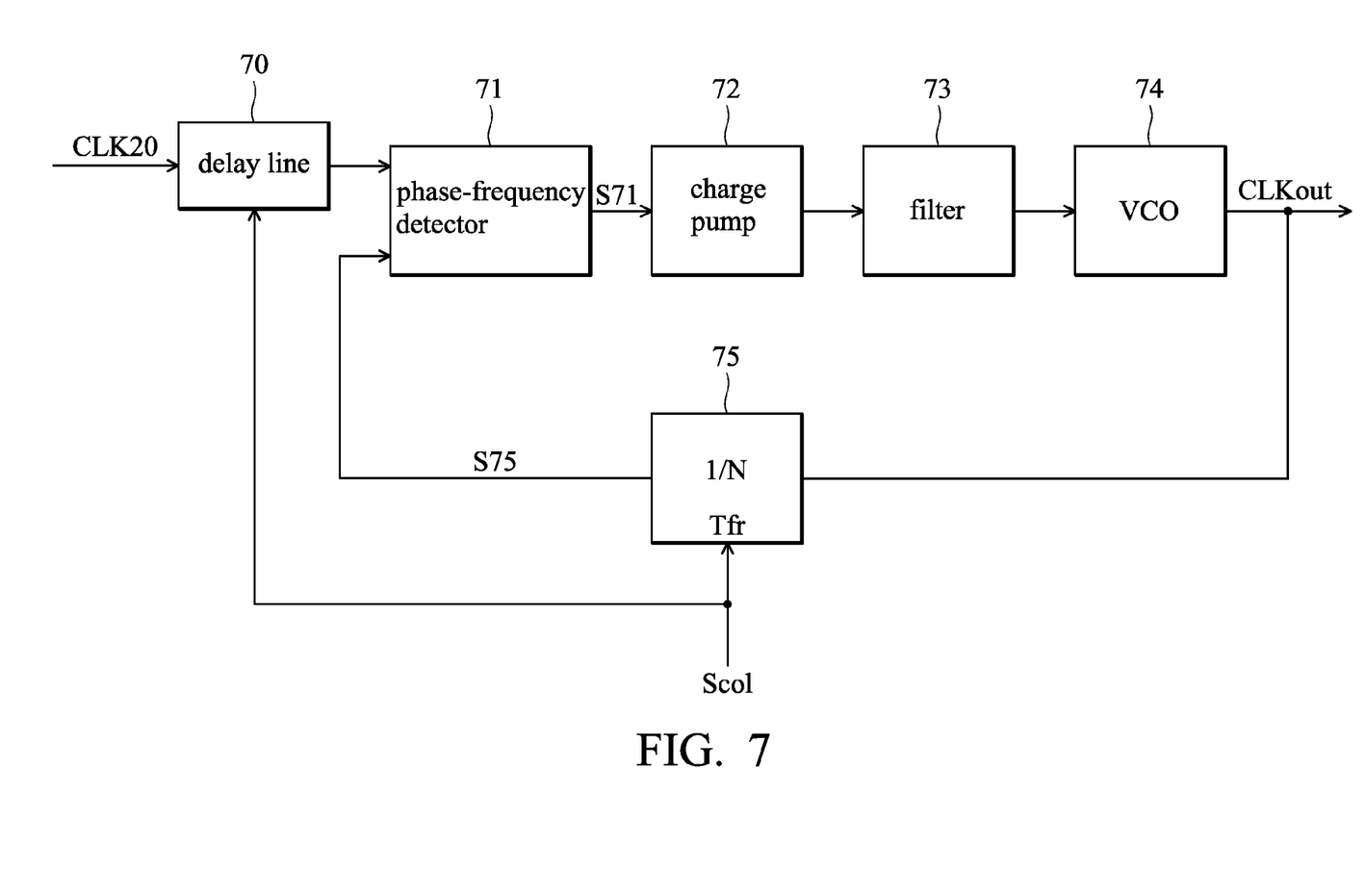
FIG. 7 shows an exemplary embodiment of a digital delay lined based fractional-N PLL.
Figure 8:
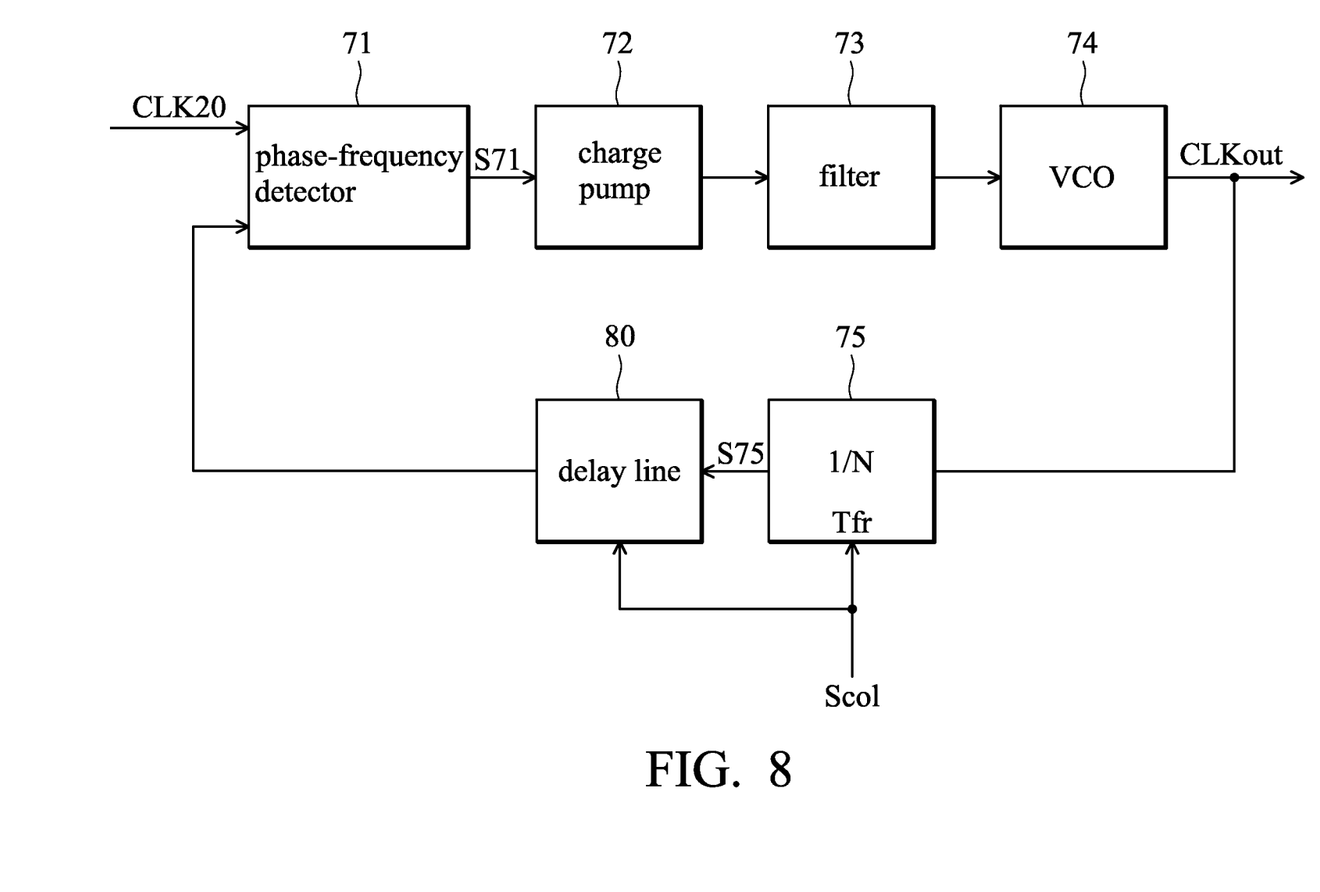
FIG. 8 shows another exemplary embodiment of a digital delay lined based fractional-N PLL.

In the embodiments of FIGS. 2 and 5, the PLL 21 can be implemented by a fractional-N PLL as shown in FIG. 6 or a digital delay lined based fractional-N PLL as shown in FIGS. 7 and 8. Referring to FIG. 6, a fractional-N PLL 6 comprises a phase-frequency detector 60, a charge pump 61, a filter 62, a voltage controlled oscillator (VCO) 63, and a 1/N divider 64 having a fractional control terminal Tfr. The phase-frequency detector 60 receives the clock signal CLK20 which serves as a reference clock signal and further receives a feedback divided signal S64. The phase-frequency detector 60 generates a detection signal S60 according to the reference clock signal CLK20 and the feedback divided signal S64. By processing the detection signal S60 through the charge pump 61, the filter 62, and the VCO 63, the output clock signal CLKout is generated. The fractional control terminal Tfr of the 1/N divider 64 receives the control signal Scol from the calibrator 22 in FIG. 2. The divider 64 divides the frequency of the output clock signal CLKout according to the control signal Scol and generates the feedback divided signal S64. Moreover, in other embodiments, there is a phase adjustment device 65 coupled between the divider 64 and the VCO 63 to process the output clock signal CLKout, wherein the phase adjustment device 65 is controlled by the control signal Scol to adjust phases of the output clock signal CLKout before inputting to the divider 64.

As shown in FIG. 7, a digital delay lined based fractional-N PLL 7 comprises a controllable delay line 70, a phase-frequency detector 71, a charge pump 72, a filter 73, a voltage controlled oscillator (VCO) 74, and a 1/N divider 75 having a fractional control terminal Tfr. The clock signal CLK20 which serves as a reference clock signal is provided to the phase-frequency detector 71 through the controllable delay line 70 which is controlled by the control signal Scol. The phase-frequency detector 71 generates a detection signal S71 according to the reference clock signal CLK20 and the feedback divided signal S75. By processing the detection signal S71 through the charge pump 72, the filter 73, and the VCO 74, the output clock signal CLKout is generated. The fractional control terminal Tfr of the 1/N divider 75 receives the control signal Scol from the calibrator 22. The divider 75 divides the frequency of the output clock signal CLKout according to the control signal Scol and generates the feedback divided signal S75. Moreover, in other variations, there is also a phase adjustment device (not shown) coupled between the divider 75 and the VCO 74 to process the output clock signal CLKout, the detail is similar as the description of FIG. 6, and is omitted for simplicity. It is noted that the delay line 70 is used to adjust fractional delay of this circuit by controlling of the control signal Scol, wherein the delay line 70 can be example configured by several delay inverters connected seriously.

As shown in FIG. 8, another digital delay lined based fractional-N PLL 8 is provided. The difference between the digital delay lined based fractional-N PLLs 7 and 8 is that, in the digital delay lined based fractional-N PLL 8, the reference clock signal CLK20 is directly provided to the phase-frequency detector 71 and that, in the digital delay lined based fractional-N PLL 8, the feedback divided signal S75 is provided to the phase-frequency detector 71 through a controllable delay line 80. The digital controlled delay line 80 is controlled by the control signal Scol. Similarly, in other variations, there is also a phase adjustment device (not shown) coupled between the divider 75 and the VCO 74 to process the output clock signal CLKout, and the detail description is omitted for simplicity.

The fractional-N PLLs in FIGS. 6-8 are examples for the PLL 21 of FIG. 2, however, without limitation. The PLL 21 can be implemented by any type of fractional-N PLL.

Figure 9:
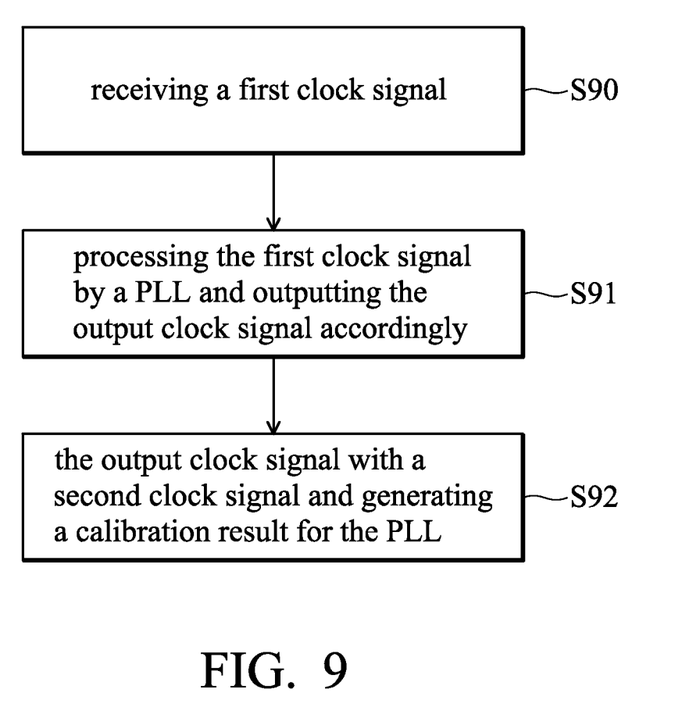
FIG. 9 shows a flowchart of an exemplary embodiment of a method used to generate an output clock signal for a transmitter to transmit data.

FIG. 9 shows a flowchart of an exemplary embodiment of a method used to generate an output clock signal for a transmitter to transmit data. The method will be described with reference to FIG. 9. First, a first clock signal is received by the transmitter (step S90). In the embodiment, the first clock signal is derived from a resonator. A phase locked loop (PLL) of the transmitter processes the first clock signal and outputs an output clock signal accordingly (step S91). Then, the output clock signal is calibrated with a second clock signal and a calibration result is generated for the PLL (step S92), wherein the second clock signal is derived from a host communicated with a device using the transmitter. In some embodiments, when the second clock signal is not stable, the calibrating step S92 holds. According to above the steps of the methods, the output clock signal can track the second clock signal according to the calibration result, and the output clock signal can be applied in a SATA system to transmit data.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock generation circuit for a transmitter, wherein the transmitter transmits data according to an output clock signal comprising:
a phase locked loop (PLL) arranged to receive a first clock signal and generate the output clock signal, wherein the PLL adjusts the frequency of the output clock signal according to a control signal; and
a calibrator arranged to receive the output clock signal and a second clock signal, execute a frequency calibration between the output clock signal and the second clock signal, and generate the control signal according to results of the frequency calibration;
wherein the calibrator comprises:
a frequency detector arranged to receive the output clock signal and the second clock signal, determine which one of frequencies of the output clock and second clock signals is higher, and generate a first detection signal and a second detection signal according to the determined result; and
a calculation unit arranged to receive the first and second detection signals and perform subtraction calculation to the first and second detection signals to generate a calculation signal;
wherein the control signal is generated according to the calculation signal.

2. The clock generation circuit as claimed in claim 1, wherein before the calibrator receives the second clock signal, the PLL generates the output clock signal according to the first clock signal.

3. The clock generation circuit as claimed in claim 1, wherein after the calibrator receives the second clock signal, the PLL switches to generate the output clock signal according to the second clock signal when a frequency of the output clock signal generated according to the first clock signal is not within a range required for specification of the transmitter.

4. The clock generation circuit as claimed in claim 1, wherein when the calibrator determines that the frequency of the output clock signal is lower than the frequency of the second clock signal, the calibrator changes a value derived from the control signal, and the PLL increases the frequency of the output clock signal according to the control signal with the changed value.

5. The clock generation circuit as claimed in claim 1, wherein when the calibrator determines that the frequency of the output clock signal is higher than the frequency of the second clock signal, the calibrator changes a value derived from the control signal, and the PLL decreases the frequency of the output clock signal according to the control signal with the changed value.

6. The clock generation circuit as claimed in claim 1, wherein the first clock signal is generated from a clock unit implemented by an on-board clock source.

7. The clock generation circuit as claimed in claim 1, wherein the second clock signal is provided from an external device outside the clock generation circuit.

8. The clock generation circuit as claimed in claim 1, wherein the calibrator comprises:
a filter arranged to receive and filter the calculation signal to generate the control signal.

9. The clock generation circuit as claimed in claim 1, wherein when the frequency detector determines that frequency of the output clock signal is higher than frequency of the second clock signal, the calculation unit generates the calculation signal to enable the PLL to decreases the frequency of the output clock signal.

10. The clock generation circuit as claimed in claim 1, wherein when the frequency detector determines that frequency of the output clock signal is lower than frequency of the second clock signal, the calculation unit generates the calculation signal to enable the PLL to increases the frequency of the output clock signal.

11. The clock generation circuit as claimed in claim 1, further comprises a first divider arranged to receive and divide the frequency of the second clock signal by a first predetermined value to generate a first divided clock signal to the frequency detector.

12. The clock generation circuit as claimed in claim 1, further comprises a second divider arranged to receive and divide the frequency of the output clock signal by a second predetermined value to generate a second divided clock signal to the frequency detector.

13. The clock generation circuit as claimed in claim 1, wherein the PLL is a fractional PLL for receiving the control signal.

14. The device as claimed in claim 1, wherein after the calibrator receives the second clock signal, the PLL generates the output clock signal according to the second clock signal additionally when a frequency of the output clock signal generated according to the first clock signal is not within a range required for specification of the transmitter.

15. A device communicating with a host, comprising:
a receiver arranged to receive host data from the host and recover the host data to generate a host clock signal;
a phase locked loop (PLL) arranged to receive a local clock signal, be controlled by a control signal, and generate an output clock signal according to the local clock signal and the control signal;
a calibrator arranged to receive the output clock signal and the host clock signal, operate a frequency calibration between the output clock signal and the host clock signal, and generate the control signal according to results of the frequency calibration, wherein the PLL adjusts the frequency of the output clock signal according to the control signal; and
a transmitter arranged to transmit device data according to the output clock signal;
wherein the calibrator comprises:
a frequency detector arranged to receive the output clock signal and the host clock signal, determine which one of frequencies of the output clock and host clock signals is higher, and generate a first detection signal and a second detection signal according to the determined result; and
a calculation unit arranged to receive the first and second detection signals and perform subtraction calculation to the first and second detection signals to generate a calculation signal;
wherein the control signal is generated according to the calculation signal.

16. The device as claimed in claim 15, further comprises a signal detection unit to generate a flag signal to control the calibrator operating the frequency calibration between the output clock signal and the host clock signal.

17. The device as claimed in claim 15, wherein when the calibrator determines that the frequency of the output clock signal is lower than the frequency of the host clock signal, the calibrator changes a value derived from the control signal, and the PLL increases the frequency of the output clock signal according to the control signal with the changed value.

18. The device as claimed in claim 15, wherein when the calibrator determines that the frequency of the output clock signal is higher than the frequency of the host clock signal, the calibrator changes a value derived from the control signal, and the PLL decreases the frequency of the output clock signal according to the control signal with the changed value.

19. The device as claimed in claim 15, wherein the adjusted frequency of the output clock signal is within a range required for specification of the transmitter.

20. The device as claimed in claim 15, further comprises a clock unit implemented by an on-board clock source to generate the local clock signal.

21. The device as claimed in claim 15, wherein the calibrator comprises:
    a filter receiving and filtering the calculation signal to generate the control signal.

22. The device as claimed in claim 15, wherein when the frequency detector determines that frequency of the output clock signal is higher than frequency of the host clock signal, the calculation unit generates the calculation signal with a negative value by subtracting the second detection signal from the first detection signal, and a value derived from the control signal is decreased according to the calculation signal with the positive value, so that the PLL decreases the frequency of the output clock signal according to the control signal with the decreased value.

23. The device as claimed in claim 15, wherein when the frequency detector determines that the frequency of the output clock signal lower than the frequency of the host clock signal, the calculation unit generates the calculation signal with a positive value by subtracting the second detection signal from the first detection signal, and a value derived from the control signal is increased according to the calculation signal with the positive value, so that the PLL increases the frequency of the output clock signal according to the control signal with the increased value.

24. The device as claimed in claim 15, further comprises a first divider receiving the host clock signal and dividing the frequency of the host clock signal by a first predetermined value to generate a first divided clock signal to the frequency detector.

25. The device as claimed in claim 15, further comprises a second divider receiving the output clock signal and dividing the frequency of the output clock signal by a second predetermined value to generate a second divided clock signal to the frequency detector.

26. The device as claimed in claim 15, wherein the PLL is a fractional PLL for receiving the control signal.

27. The device as claimed in claim 15, wherein the receiver comprises a clock-data recovery circuit for recovering the host data to generate the host clock signal.

28. A communication system, comprising:
    a host comprising a host transmitter and a host receiver, wherein the host transmitter transmits a host data; and
    a device for communicating with the host and receiving the host data, wherein the device comprises:
    a device receiver arranged to receive and recover host data to generate a host clock signal;
    a clock unit arranged to generate a local clock signal;
    a phase locked loop (PLL) arranged to receive the local clock signal and generate an output clock signal according to the local clock signal and a control signal;
    a calibrator arranged to receive the output clock signal and the host clock signal, operate a frequency calibration between the output clock signal and the host clock signal, and generate the control signal according to results of the frequency calibration, wherein the PLL adjusts the frequency of the output clock signal according to the control signal; and
    a device transmitter arranged to transmit device data according to the output clock signal to the host receiver;
    wherein the calibrator comprises:
    a first divider arranged to receive the host clock signal and divide the frequency of the host clock signal by a predetermined value to generate a first divided clock signal;
    a second divider arranged to receive the output clock signal and divide the frequency of the output clock signal by the predetermined value to generate a second divided clock signal;
    a phase-frequency detector arranged to receive the first and second divided clock signals, determine which one of the first and second divided clock signals leads the other, and generate a first detection signal and a second detection signal according to the determined result; and
    a calculation unit arranged to receive the first and second detection signals and perform subtraction calculation to the first and second detection signals to generate a calculation signal;
    wherein the control signal is generated according to the calculation signal.

29. The communication system as claimed in claim 28, wherein the clock unit is implemented by an on-board clock source.

30. The communication system as claimed in claim 28, wherein the calibrator comprises:
    a gain stage arranged to receive and amplify the calculation signal; and
    a filter arranged to receive and filter the amplified calculation signal to generate the control signal.

31. The communication system as claimed in claim 28, wherein when the phase-frequency detector determines that the first divided signal leads the second divided signal, the calculation unit generates the calculation signal with a positive value by subtracting the second detection signal from the first detection signal, and a value derived from the control signal is increased according to the calculation signal with the positive value, so that the PLL increases the frequency of the output clock signal according to the control signal with the increased value.

32. The communication system as claimed in claim 28, wherein when the phase-frequency detector determines that the first divided signal lags the second divided signal, the calculation unit generates the calculation signal with a negative value by subtracting the second detection signal from the first detection signal, and a value derived from the control signal is decreased according to the calculation signal with the positive value, so that the PLL decreases the frequency of the output clock signal according to the control signal with the decreased value.

33. The communication system as claimed in claim 28, wherein the PLL is a fractional PLL which has a fractional control terminal for receiving the control signal.

34. The communication system as claimed in claim 28, wherein the receiver comprises a clock-data recovery circuit for recovering the data to generate the host clock signal.

35. A method used to generate an output clock signal for a transmitter to transmit data, comprising:
    receiving a first clock signal and a second clock signal;
    processing the first clock signal by a phase locked loop (PLL) and outputting the output clock signal accordingly; and
    calibrating the output clock signal with a second clock signal and generating a calibration result for the phase locked loop;
    determining which one of frequencies of the output clock and second clock signals is higher;
    generating a first detection signal and a second detection signal according to the determined result; and performing subtraction calculation to the first and second detection signals to generate a calculation signal;

wherein the output clock signal tracks the second clock signal according to the calibration result.

36. The method as claimed in claim 35, wherein the first clock signal is derived from a resonator.

37. The method as claimed in claim 35, wherein the second clock signal is derived from a host.

38. The method as claimed in claim 35, wherein the output clock signal is used in a SATA system to transmit data.

39. The method as claimed in claim 35, wherein the calibrating step holds when the second clock signal is not stable.

* * * * *